(12) United States Patent
Ilg et al.

(10) Patent No.: US 6,190,955 B1
(45) Date of Patent: Feb. 20, 2001

(54) FABRICATION OF TRENCH CAPACITORS USING DISPOSABLE HARD MASK

(75) Inventors: Matthias Ilg, Richmond, VA (US); Richard L. Kleinhenz, Wappingers Falls, NY (US); Soichi Nadahara, Kanagawa (JP); Ronald W. Nunes, Hopewell Junction, NY (US); Klaus Penner, Attendorf-Okrilla; Klaus Roithner, Assling, both of (DE); Radhika Srinivasan, Mahwah, NJ (US); Shigeki Sugimoto, Kanawawa (JP)

(73) Assignees: International Business Machines Corporation, Armonk, NY (US); Infineon Technologies North America Corp., San Jose, CA (US); Kabushiki Kaisha Toshiba, Kawasaki (JP)

( * ) Notice: Under 35 U.S.C. 154(b), the term of this patent shall be extended for 0 days.

(21) Appl. No.: 09/014,433

(22) Filed: Jan. 27, 1998

(51) Int. Cl.$^7$ ............................................... H01L 21/8244
(52) U.S. Cl. .................. 438/238; 438/239; 438/243; 438/717; 438/736
(58) Field of Search .................... 438/238, 239, 438/243, 386, 952, 717, 736

(56) References Cited

U.S. PATENT DOCUMENTS

| | | | |
|---|---|---|---|
| 4,794,434 | 12/1988 | Pelley, III | 357/23.6 |
| 5,283,453 | 2/1994 | Rajeevakumar | 257/304 |
| 5,348,905 | 9/1994 | Kenney | 437/52 |
| 5,362,663 | 11/1994 | Bronner et al. | 437/52 |
| 5,395,786 | 3/1995 | Hsu et al. | 437/526 |
| 5,405,796 | 4/1995 | Jones, Jr. | 437/47 |
| 5,409,563 | 4/1995 | Cathey | 156/643 |
| 5,434,109 | 7/1995 | Geissler et al. | 437/239 |
| 5,532,193 | * 7/1996 | Maeda et al. | 437/243 |
| 5,554,485 | * 9/1996 | Dichiara et al. | 430/271.1 |
| 5,606,188 | 2/1997 | Bronner et al. | 257/301 |
| 5,618,751 | 4/1997 | Golden et al. | 438/392 |
| 5,627,092 | 5/1997 | Alsmeier et al. | 438/152 |
| 5,627,395 | 5/1997 | Witek et al. | 257/350 |
| 5,643,836 | 7/1997 | Meister et al. | 437/228 |
| 5,656,535 | 8/1997 | Ho et al. | 438/386 |
| 5,656,544 | 8/1997 | Bergendahl et al. | 438/386 |
| 5,658,417 | 8/1997 | Watanabe et al. | 156/345 |
| 5,670,423 | 9/1997 | Yoo | 437/192 |
| 5,677,219 | 10/1997 | Mazureet et al. | 437/52 |
| 5,760,483 | * 6/1998 | Bruce et al. | 257/797 |
| 5,776,808 | * 7/1998 | Muller et al. | 438/243 |
| 5,907,771 | * 5/1999 | Ploessl et al. | 438/243 |

* cited by examiner

Primary Examiner—Matthew Smith
Assistant Examiner—Renzo Rocchegiani
(74) Attorney, Agent, or Firm—Steven Capella

(57) ABSTRACT

Improved trench forming methods for semiconductor substrates using BSG avoid the problems associated with conventional TEOS hard mask techniques. The methods comprise:

(a) providing a semiconductor substrate, (b) applying a conformal layer of borosilicate glass (BSG) on the substrate;

(c) forming a patterned photoresist layer over the BSG layer whereby a portion of a layer underlying the photoresist layer is exposed, (d) anisotropically etching through the exposed portion of the underlying layer, through any other layers lying between the photoresist layer and the semiconductor substrate, and into the semiconductor substrate, thereby forming a trench in the semiconductor substrate.

Preferably, one or more dielectric layers are present on the substrate surface prior to application of the BSG layer. One or more chemical barrier and/or organic antireflective coating layers may be applied over the BSG layer between the BSG layer and the photoresist layer. The methods are especially useful for forming deep trenches in silicon substrates with pad dielectric layers.

19 Claims, 5 Drawing Sheets

FABRICATION OF TRENCH CAPACITORS USING DISPOSABLE HARD MASK

BACKGROUND OF THE INVENTION

The trench capacitor is a well known capacitor design for use in integrated circuits (IC), especially in IC memory devices. While variations exist in particular designs, trench capacitors are generally characterized by the formation of a deep trench in the semiconductor substrate (wafer) typically normal to the principal plane of the substrate. Deeper and narrower trenches are generally more desirable in that they reduce the area in the principal plane occupied by the capacitor. The reduction of the planar area occupied by the capacitor allows capacitors and other devices forming the integrated circuit to be placed more closely together on the chip. More dense packing of the integrated circuit design may enable improved circuit designs and improved circuit performance.

The formation of trench capacitors and other trench-based devices typically involves selectively etching the substrate whereby a trench is formed in the substrate. The composition of the substrate in the vicinity of the trench and the composition components arranged in the trench are manipulated to form the desired capacitor or other trench device. Thus, for example, the substrate area immediately underlying the trench may be doped with a charge carrier species, portions of the trench may be lined with a dielectric material, the trench may be back filled with a charge storage material, etc.

In many instances, it is desirable to form layers on the substrate surface prior to forming the desired trenches in the surface. For example, one or more "pad" dielectric (oxide and/or nitride) layers may be applied to the substrate surface prior to formation of the trench. These dielectric layers are typically needed outside the trench as part of the ultimate circuit structure or as part of the overall circuit fabrication process.

General methods for forming trenches are well known. Typically, a TEOS (tetraethyl orthosilicate) hard mask is deposited over the dielectric layers by chemical vapor deposition. A photoresist layer applied over the TEOS layer and is patterned corresponding to the desired trench locations on the substrate. The substrate with the patterned photoresist is then etched where by trenches are formed in the substrate. The substrate is then subjected to further processing which may vary depending of the design of the integrated circuit, the desired performance level for the circuit, etc. Typically, the trenches will be used to form trench capacitors.

The trench formation method using a TEOS hard mask is widely used. See for example U.S. Pat. Nos. 5,656,535; 5,348,905; 5,362,663; 5,618,751 and 5,657,092, the disclosures of which are incorporated herein by reference. Unfortunately, the current process is problematic since it is difficult to remove the TEOS layer after trench formation (e.g. prior to formation of the buried plate) without adversely affecting existing oxide structures such as pad oxides. Thus, the removal of the TEOS layer must be delayed to a further point in the fabrication process. In the course of the delay, the underlying layers such as the pad nitride layer may be adversely affected (e.g. they may lose uniformity, etc.).

SUMMARY OF THE INVENTION

The invention provides improved trench forming methods for semiconductor substrates which avoid the problems associated with conventional TEOS hard mask techniques.

The invention encompasses a method of forming a trench in a semiconductor substrate, the method comprising:

(a) providing a semiconductor substrate, (b) applying a conformal layer of borosilicate glass (BSG) on the substrate;

(c) forming a patterned photoresist layer over the BSG layer whereby a portion of a layer underlying the photoresist layer is exposed, (d) anisotropically etching through the exposed portion of the underlying layer, through any other layers lying between the photoresist layer and the semiconductor substrate, and into the semiconductor substrate, thereby forming a trench in the semiconductor substrate.

Preferably, one or more dielectric layers are present on the substrate surface prior to application of the BSG layer. One or more chemical barrier and/or organic antreflective coating layers may be applied over the BSG layer between the BSG layer and the photoresist layer. Step (d) may comprise discrete steps of etching the pattern in the BSG mask (mask open etch) followed by etching into the substrate (trench etch).

The invention is especially useful for forming deep trenches in silicon substrates with pad dielectric layers. These and other aspects of the invention are described in further detail below.

DETAILED DESCRIPTION OF THE INVENTION

The invention encompasses improved methods of forming trenches in semiconductor substrates which avoid the disadvantages of TEOS hard mask processes. The methods of the invention are especially useful where the substrate has pad dielectric layers applied prior to trench formation such as is typically done in the formation of trench capacitors.

The methods of the invention preferably comprise:

(a) providing a semiconductor substrate, (b) applying a conformal layer of borosilicate glass (BSG) on the substrate;

(c) forming a patterned photoresist layer over the BSG layer whereby a portion of a layer underlying the photoresist layer is exposed, (d) anisotropically etching through the exposed portion of the underlying layer, through any other layers lying between the photoresist layer and the semiconductor substrate, and into the semiconductor substrate, thereby forming a trench in the semiconductor substrate.

In addition to these basic steps, the method of the invention may include additional features such as the provision of dielectric layers on the substrate surface, use of chemical barrier layers and/or antireflective coatings between the BSG and the photoresist layers, and the removal of the BSG layer after trench formation.

An example of one embodiment of the invention is schematically illustrated in FIGS. 1–5. The relative dimensions shown in the figures are not to scale. For simplicity, the figures illustrate the formation of a single trench. The methods of the invention most typically would be used to form a plurality of trenches in a given substrate.

Figure 1:
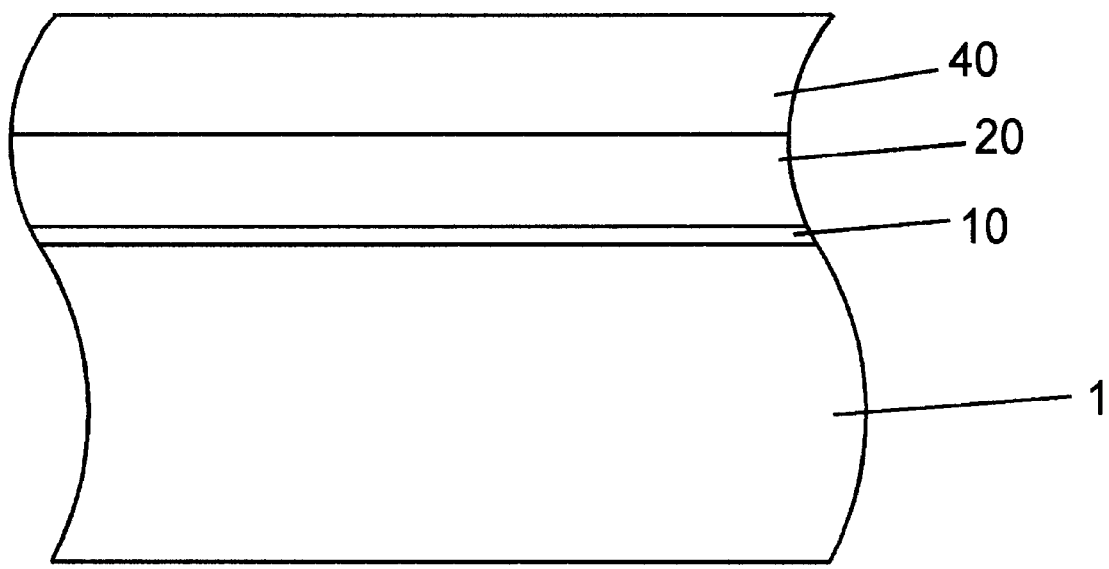
FIG. 1 is a schematic cross section of a silicon substrate with a BSG hard mask according to an embodiment of the invention.
Figure 2:
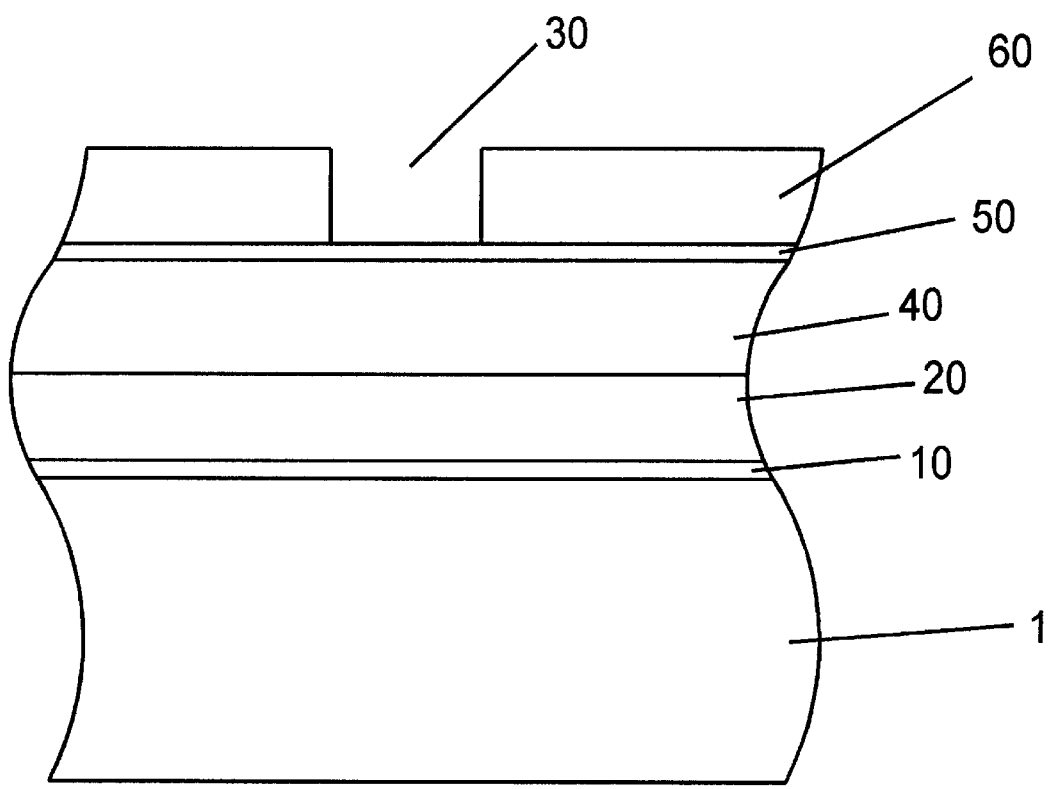
FIG. 2 is a schematic cross section of a silicon substrate with a BSG hard mask of FIG. 1 with applied chemical barrier and photoresist layers.
Figure 3:
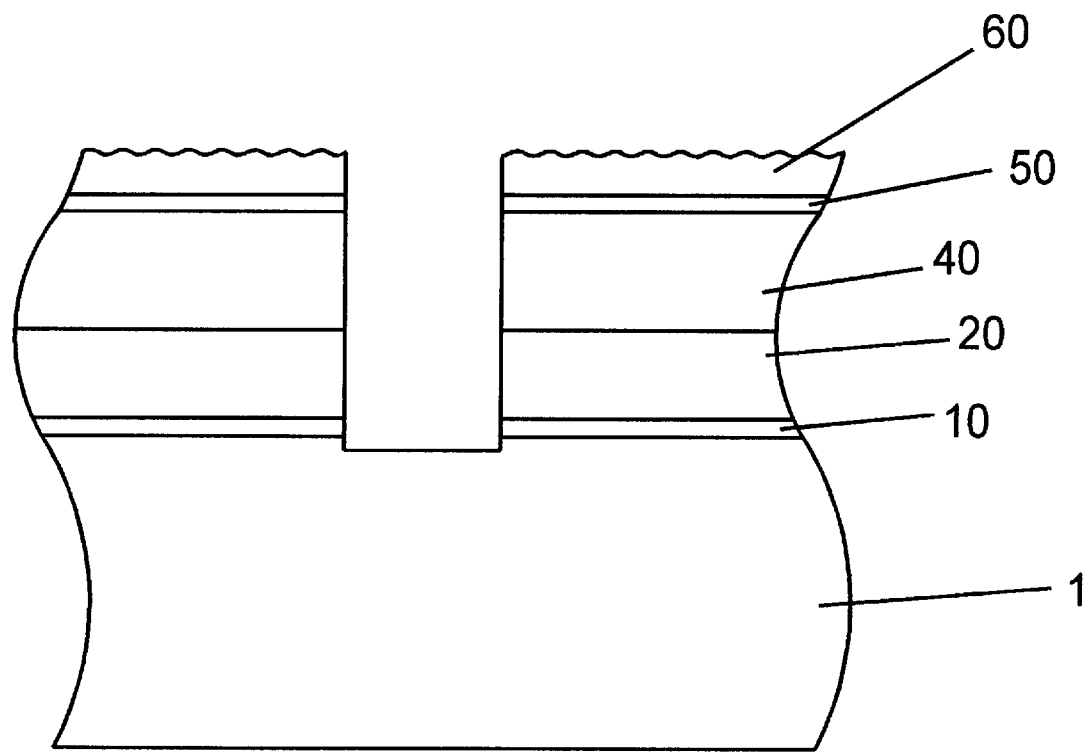
FIG. 3 is a schematic cross section of the substrate with applied layers of FIG. 2 after mask open etch.
Figure 4:
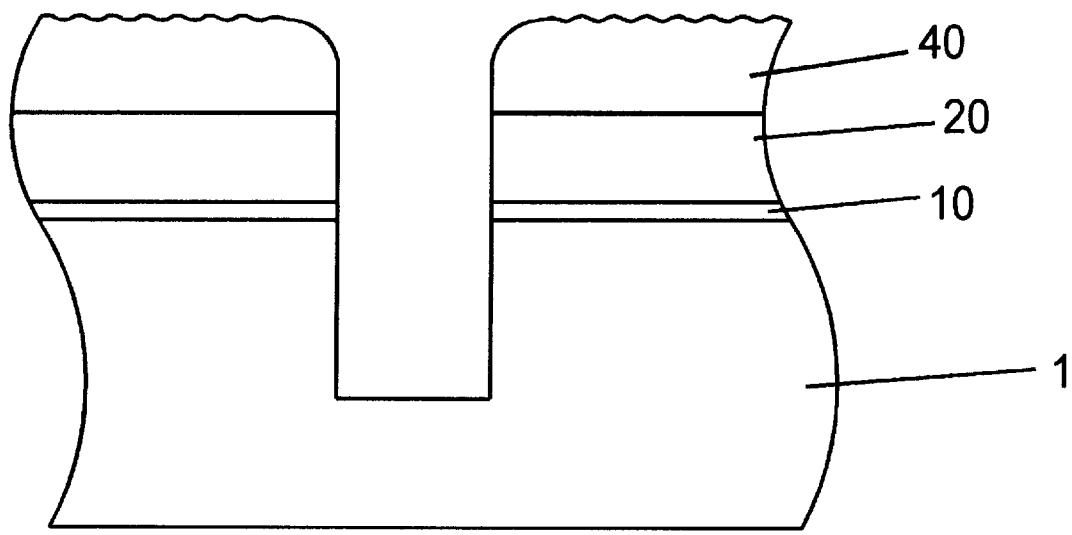
FIG. 4 is a schematic cross section of the substrate with applied layers of FIG. 3 at the completion of trench etching.
Figure 5:
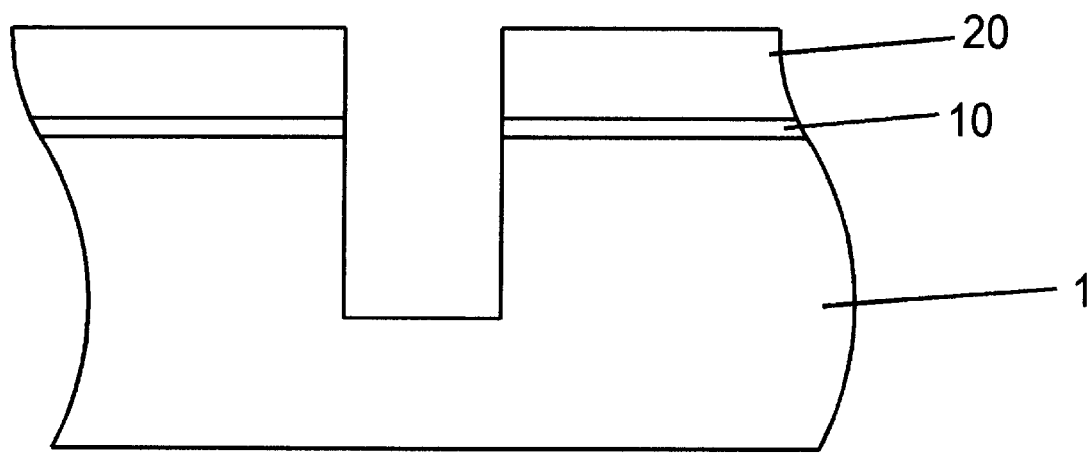
FIG. 5 is a schematic cross section of the substrate with applied layers of FIG. 4 on removal of the remaining BSG layer.

In FIG. 1, an initial substrate I having pad dielectric oxide 10 and pad dielectric nitride 20 thereon. Above the pad dielectric layers is the applied BSG layer. In FIG. 2, layer 50 represents an applied chemical barrier or antireflective coating layer and layer 60 represents a patterned photoresist layer showing an exposed underlying layer at 30. FIG. 3 shows an intermediate step in the trench etching step (d) where etching of the BSG hard mask ("mask open etch") has been completed. Typically, at least a portion (if not all) of the photoresist layer 60 would have been removed at this point. Where the photoresist has not been completely removed, it is preferably stripped prior to etching of the trench ("trench etch"). The remaining photresist (and organic byproducts/organic antireflective coating, if any) may be stripped by wet or dry etching using techniques known in the art. The photoresist is typically incompatible with the chemistry of the trench etch. FIG. 4 shows the completion of the trench etching step (d). Etching to this point typically will result in some erosion of the BSG layer 40. Lastly, FIG. 5 shows the structure remaining after removal of the BSG layer. Advantageously, the planarity of dielectric layer 20 is generally well preserved.

The semiconductor substrate used in the invention may be any conventional semiconductor substrate, preferably in wafer form. The semiconductor substrate is preferably monocrystalline. Silicon is the preferred semiconductor material. It may be possible to use a doped semiconductor substrate as the starting substrate depending on the overall integrated circuit design and intended use.

While the invention does not require the formation of dielectric pad layers, typically such pad layers are often employed in manufacturing processes where trenches are formed in the substrate. If pad dielectric layers are desired, they may be formed by any conventional technique. Preferably, the pad dielectric layers are formed by chemical vapor deposition. Preferably, the substrate is provided with at least two dielectric pad layers, the dielectric layer closest to the substrate preferably being an oxide (e.g. a silicon oxide). At least one of the dielectric layers is preferably a nitride such as silicon nitride, silicon oxynitride, etc. The pad dielectric layers are preferably conformal and substantially planar as applied to the substrate. If an oxide dielectric layer is used, it preferably has a thickness of about 5–15 nm, more preferably about 10 nm. If a nitride dielectric layer is used, it preferably has a thickness of about 150–300 nm, more preferably about 200–250 nm.

The BSG layer may be formed by any conventional technique. Preferably, the BSG layer is formed by chemical vapor deposition (e.g. atmospheric CVD or LPCVD) using techniques known in the art such as those described in U.S. Pat. Nos. 3,751,314, 5,584,941, and 5,677,225, the disclosures of which are incorporated herein by reference. The BSG layer applied in step (b) has a thickness of about 500–1000 nm, more preferably about 600–700 nm. The BSG layer has a boron content of at least about 5 wt. % measured as $B_2O_3$, more preferably about 5.5–5.6 wt. %. In general, excessive levels of boron are preferably avoided. That is, the boron content is preferably not more than what is needed to provide selective removal (relative to oxide, nitride and silicon) of the BSG layer after formation of the trench.

The methods of the invention do not strictly require the use of chemical barrier or antireflective coating layers, however, in many instances, it is preferable to use one or more chemical barrier and/or antireflective coating layers.

The function of the chemical barrier layer is to prevent unwanted interaction between boron in the BSG layer and the subsequently deposited photoresist layer. The need for a chemical barrier layer may depend on the photoresist composition used, the boron content of the BSG, etc. If used, a preferred chemical barrier layer is amorphous α-silicon. Such amorphous silicon may be formed by sputtering or chemical vapor deposition using techniques well known in the art. Preferably, sputtering is used. The amorphous silicon is preferably applied at a thickness of about 5–20 nm, more preferably about 10 nm.

Organic antireflective coating layers may be used alone or in combination with a separate chemical barrier layer. In some instances, the antireflective coating may provide sufficient chemical barrier effect such that the need of a separate chemical barrier (e.g., amorphous a-silicon) is avoided. If used, the antireflective coating is preferably applied immediately below the photoresist layer. If both a chemical barrier layer and an antireflective coating layer are used, the antireflective coating layer is preferably situated between the chemical barrier layer and the photoresist layer. Preferred antireflective coating materials comprise poly (arylether) polymer. The antireflective coating is preferably applied using conventional spin coating techniques.

The formation of the patterned photoresist layer may be done by any conventional technique. Typically, a photoresist layer will be applied to the uppermost layer on the substrate. The photoresist layer is then patternwise exposed to a suitable radiation wavelength to induce a change in one or more characteristics (typically relative solubility) for the exposed regions of the resist layer. The patternwise exposed photoresist is then developed (e.g. by treatment with a solvent) to reveal the desired pattern of exposed locations (e.g. 30 in FIG. 2) in the layer underlying the photoresist which correspond to the desired trench locations.

The substrate with the patterned photoresist layer is then anisotropically etched to selectively remove the portions of the layers directly under the exposed locations in the photoresist pattern including a portion of the semiconductor substrate thereby forming the desired trenches. The etching may be performed by any conventional anisotropic etching technique such as reactive ion etching or other dry etching technique. Preferably, the etching involves the use of one or more halogen compounds. The etching step may involve the use of different combinations of etching conditions and techniques as the etching progresses through the various layers. Preferably, the etching comprises (1) a mask open etch where the pattern from the photoresist layer is transferred to the BSG mask (as shown in FIG. 3), (2) stripping of any remaining photoresist on the substrate, and (3) trench etch in the semiconductor substrate. Typically, a portion of the BSG layer itself may be removed in the course of the trench etch step. Etching step (d) is preferably conducted until the trench formed has a depth in the semiconductor substrate of at least about 3 microns, more preferably about 4–10 microns. In some instances, post-etch cleaning steps may be employed to removed residues present in the trench.

Once the etching is completed, the remaining BSG layer may be removed. The BSG layer is preferably removed prior to further processing of the substrate. The BSG layer is preferably selectively removed by contacting the BSG layer with an HF-containing vapor. Alternatively, liquid etching techniques using a combination of HF and sulfuric acid may be used. Examples of suitable HF treatments are disclosed in U.S. Pat. No. 5,658,417, the disclosure of which is incorporated herein by reference. Advantageously, the BSG layer can be removed in a highly selective manner relative to the silicon substrate and the pad dielectric layers. Typically, the BSG removal step will leave a substantially planar dielectric (nitride) surface.

The substrate with the formed trenches may then be subjected to known manufacturing techniques to produce the trench-based components and other devices making up the desired integrated circuit design.

What is claimed is:

1. A method of forming a trench in a semiconductor substrate, said method comprising:

(a) providing a semiconductor material substrate with two dielectric layers are formed on said substrate prior to step (b), said two dielectric layers consisting of a silicon oxide layer closest to said substrate and a nitride layer applied over said silicon oxide layer, (b) applying a conformal layer of borosilicate glass (BSG) directly on said nitride layer, (c) forming a patterned photoresist layer over said BSG layer whereby a portion of a layer underlying said photoresist layer are exposed, (d) anisotropically etching through said exposed portion of said underlying layer, through any other layers lying between said photoresist layer, and into said semiconductor material, thereby forming a trench in said semiconductor material substrate, and (e) removing said BSG layer while said trench remains unfilled.

2. The method of claim 1 wherein a conformal organic antireflective coating layer is applied over said BSG layer prior to step (c) whereby said antireflective coating layer lies between said BSG layer and the patterned photoresist layer formed in step (c).

3. The method of claim 2 wherein said etching step comprises etching through said antireflective coating layer, said BSG layer and said dielectric layer(s).

4. The method of claim 2 wherein said antireflective coating comprises a poly (arylether) polymer.

5. The method of claim 1 wherein two dielectric layers are formed on said substrate prior to step (b), said two dielectric layers consisting of a silicon oxide layer closest to said substrate and a nitride layer applied over said silicon oxide layer.

6. The method of claim 1 wherein said etching is performed by reactive ion etching.

7. The method of claim 1 wherein said BSG layer is formed by chemical vapor deposition.

8. The method of claim 1 wherein the BSG layer applied in step (b) has a thickness of about 500–1000 nm.

9. The method of claim 8 wherein the BSG layer applied in step (b) has a thickness of about 600–700 nm.

10. The method of claim 1 wherein said silicon oxide dielectric layer has a thickness of about 0.5–1.5 nm.

11. The method of claim 1 wherein said nitride layer has a thickness of about 150–300 nm.

12. The method of claim 1 wherein said semiconductor material is selected from the group consisting of silicon and doped silicon.

13. The method of claim 1 wherein said removal comprises contacting said BSG layer with an HF-containing vapor.

14. The method of claim 1 wherein a chemical barrier layer is applied over said BSG layer prior to step (c) such that said chemical barrier layer lies between said BSG layer and said photoresist layer and prevents migration of boron from said BSG to said photoresist layer.

15. The method of claim 14 wherein said chemical barrier layer is sputtered silicon.

16. The method of claim 1 wherein said trench formed in step (d) has a depth in said substrate of at least about 3 microns.

17. The method of claim 16 wherein said depth is about 4–10 microns.

18. The method of claim 1 wherein said BSG layer has a boron content of at least about 5 wt. %.

19. The method of claim 1 wherein step (d) comprises etching the BSG layer whereby the pattern from the photoresist layer is transferred to the BSG layer, stripping of any remaining photoresist on the substrate, and etching said trench in the semiconductor substrate.

* * * * *